(12) United States Patent
Loy et al.

(10) Patent No.: US 11,211,555 B2
(45) Date of Patent: Dec. 28, 2021

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 20 days.

(21) Appl. No.: 16/513,745

(22) Filed: Jul. 17, 2019

(65) Prior Publication Data

US 2021/0020834 A1 Jan. 21, 2021

(51) Int. Cl.
*H01L 45/00* (2006.01)
*H01L 27/24* (2006.01)

(52) U.S. Cl.
CPC ...... *H01L 45/1253* (2013.01); *H01L 27/2409* (2013.01); *H01L 27/2436* (2013.01); *H01L 45/146* (2013.01); *H01L 45/1616* (2013.01); *H01L 45/1675* (2013.01)

(58) Field of Classification Search
CPC ............ H01L 45/1253; H01L 27/2409; H01L 45/1675; H01L 45/146; H01L 45/1616; H01L 27/2436; H01L 45/16; H01L 45/04; H01L 45/1273; H01L 45/145; H01L 45/1266; H01L 45/1233; H01L 27/2472
See application file for complete search history.

(56) References Cited

U.S. PATENT DOCUMENTS

| 9,431,604 | B2 | 8/2016 | Liao et al. | |
| 10,847,720 | B1 | 11/2020 | Loy et al. | |
| 2015/0069316 | A1* | 3/2015 | Lee | H01L 45/1273 257/4 |
| 2015/0340606 | A1* | 11/2015 | Tada | H01L 27/2418 257/4 |
| 2017/0117463 | A1* | 4/2017 | Chen | H01L 45/1608 |
| 2018/0138403 | A1* | 5/2018 | Chang | H01L 45/1608 |

OTHER PUBLICATIONS

Platzgummer et al., "Electron multibeam technology for mask and wafer writing at 0.1 nm address grid", Journal of Micro/Nanolithography, MEMS, and MOEMS, 2013, 9 pages, SPIE.

(Continued)

*Primary Examiner* — David Vu
(74) *Attorney, Agent, or Firm* — Viering Jentschura & Partner MBB

(57) ABSTRACT

A memory device may include at least one inert electrode, at least one mask element arranged over the at least one inert electrode, a switching layer arranged over the at least one mask element and the at least one inert electrode, and at least one active electrode arranged over the switching layer. Both of the at least one mask element and the switching layer may be in contact with a top surface of the at least one inert electrode. The switching layer in this memory device may thus include corners at which the conductive filaments may be confined. This memory device may be formed with a process that may utilize the at least one mask element to help reduce the chances of shorting between the inert and active electrodes.

14 Claims, 10 Drawing Sheets

(56) References Cited

OTHER PUBLICATIONS

Wei et al., "Highly Reliable TaOx ReRAM and Direct Evidence of Redox Reaction Mechanism", IEEE International Electron Devices Meeting, 2009, 4 pages, IEEE.

Chen et al., "Variability of Resistive Switching Memories and Its Impact on Crossbar Array Performance", International Reliability Physics Symposium, 2011, 4 pages, IEEE.

Nakayama, "ReRAM technologies: Applications and outlook", 2017 IEEE International Memory Workshop (IMW), 2017, 4 pages, IEEE.

Tkachev, "Field-Induced Generation of Electron Traps in the Tunnel Oxide of Flash Memory Cells", 2015 IEEE International Integrated Reliability Workshop (IIRW), 2015, pp. 99-102, IEEE.

Chuang et al., "Effects of Electric Fields on the Switching Properties Improvements of RRAM Device With a Field-Enhanced Elevated-Film-Stack Structure", Journal of the Electron Devices Society, 2018, pp. 622-626, vol. 6, IEEE.

Niu et al., "Geometric conductive filament confinement by nanotips for resistive switching of HfO2-RRAM devices with high performance", Scientific Reports, 2016, 9 pages, 6:25757.

Feng et al., "Investigation of switching mechanism in HfOx-ReRAM under low power and conventional operation modes", Scientific Reports, 2016, 8 pages, 6:39510.

Loy et al., "Nearest Neighbor Hopping in High Retention MgO-based Resistive Switching Devices in the High Resistance State", Abstract submitted to MRS (Materials Research Society) Spring Meeting & Exhibit, Apr. 22-26, 2019.

Mehr et al., "Ultra sharp crystalline silicon tip array used as field emitter", Microelectronic Engineering, 1996, 4 pages, 30, Elsevier.

\* cited by examiner

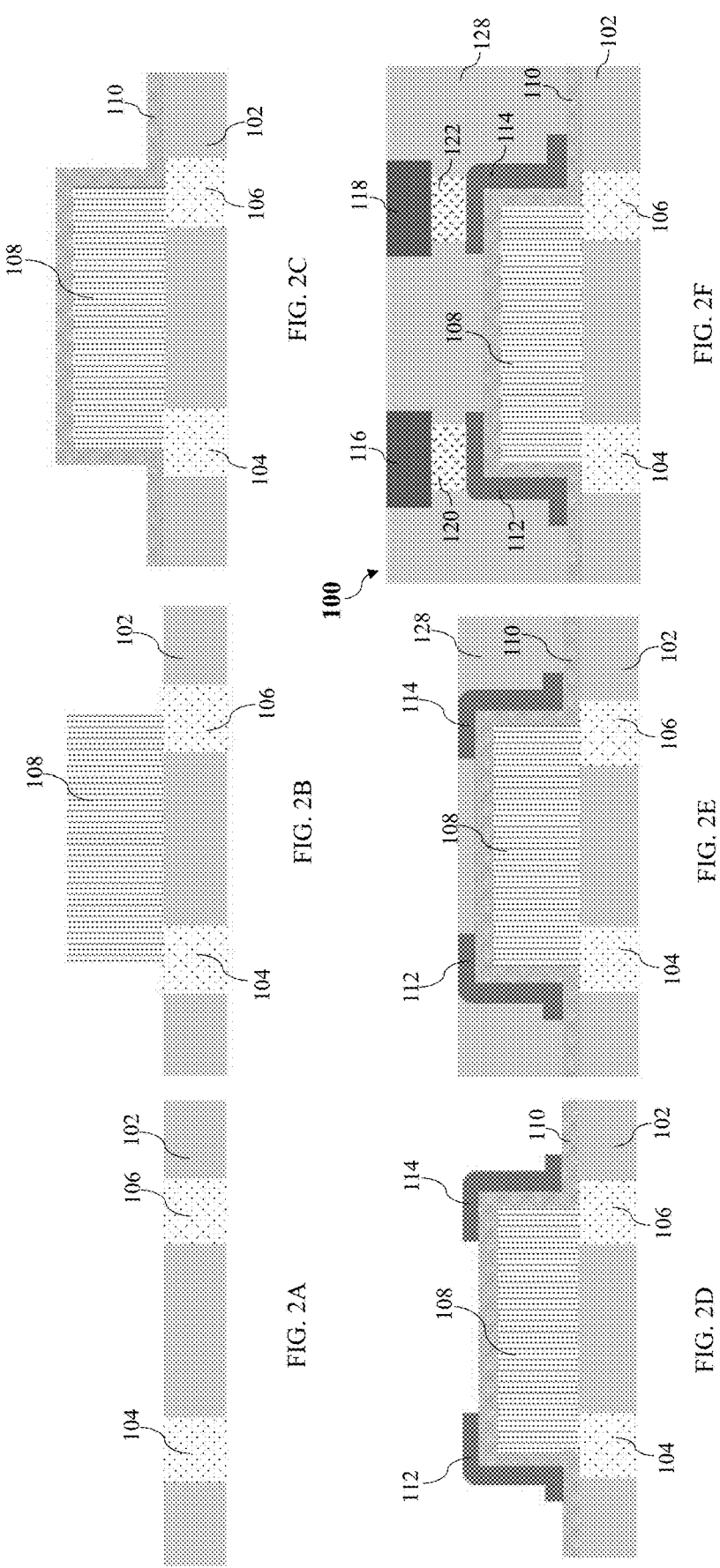

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in consumer electronic products such as smart phones and tablets. One type of non-volatile memory devices is the resistive random access memory device (RRAM). RRAMs generally operate with a fast speed and low operation voltage, and are thus useful for high-density and high-speed non-volatile memory applications.

A RRAM typically uses a switching layer such as a dielectric layer sandwiched between a top electrode and a bottom electrode. The switching layer is normally insulating. However, upon application of a sufficiently high voltage difference between the top and bottom electrodes, a dielectric breakdown event can occur and conducting filaments may be formed within the switching layer between the top and bottom electrodes. The switching layer thus becomes conductive via the conducting filaments. The switching layer can be made insulating again by applying a sufficiently low voltage difference to the top and bottom electrodes to break the conducting filaments. A typical RRAM can switch between states based on the resistance of the switching layer. When the switching layer is insulating, the switching layer has a high resistance and the RRAM may be referred to as being in a high resistance state (HRS). When the switching layer is conductive, the switching layer has a low resistance and the RRAM may be referred to as being in a low resistance state (LRS). To set the RRAM, the RRAM is switched from the HRS to the LRS. To reset the RRAM, the RRAM is switched from the LRS to the HRS. For a bipolar RRAM, the voltage applied to the top electrode is usually higher than the voltage applied to the bottom electrode when setting the RRAM; whereas, the voltage applied to the top electrode is usually lower than the voltage applied to the bottom electrode when resetting the RRAM.

During a dielectric breakdown event in a prior art RRAM, conducting filaments may be formed at random across many locations within the switching layer. Such uncontrolled distribution of the conducting filaments can cause the resistance of the switching layer (and hence, the RRAM) to vary greatly across multiple dielectric breakdown events. For example, the resistance of the switching layer when the RRAM is in the HRS tends to vary greatly over different cycles. Furthermore, shorting of the top and bottom electrodes often occurs when RRAMs are fabricated in a single etching process where the top electrode has the same dimensions as the dielectric layer and the bottom electrode. Such shorting may affect the performance and memory state of the RRAMs and permanent shorting may result in a non-workable RRAM stuck in the low resistance state.

Accordingly, it is desirable to provide an improved memory device having reduced variability in its resistance and reduced chances of having shorted top and bottom electrodes.

SUMMARY

According to various non-limiting embodiments, there may be provided a memory device including at least one inert electrode; at least one mask element arranged over the at least one inert electrode; a switching layer arranged over the at least one mask element and the at least one inert electrode; and at least one active electrode arranged over the switching layer. Both of the at least one mask element and the switching layer may be in contact with a top surface of the at least one inert electrode.

According to various non-limiting embodiments, there may be provided a method including forming at least one inert electrode; forming at least one mask element over the at least one inert electrode; forming a switching layer over the at least one mask element and the at least one inert electrode; and forming at least one active electrode over the switching layer. Both of the at least one mask element and the switching layer may be in contact with a top surface of the at least one inert electrode.

According to various non-limiting embodiments, there may be provided a memory array including a plurality of memory devices. One or more of the plurality of memory devices may include: at least one inert electrode; at least one mask element arranged over the at least one inert electrode; a switching layer arranged over the at least one mask element and the at least one inert electrode; and at least one active electrode arranged over the switching layer. Both of the at least one mask element and the switching layer may be in contact with a top surface of the at least one inert electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 2A to 2F show cross-sectional views that illustrate a method for fabricating the memory device of FIGS. 1A and 1B according to various non-limiting embodiments;

DETAILED DESCRIPTION

Figure 1A:
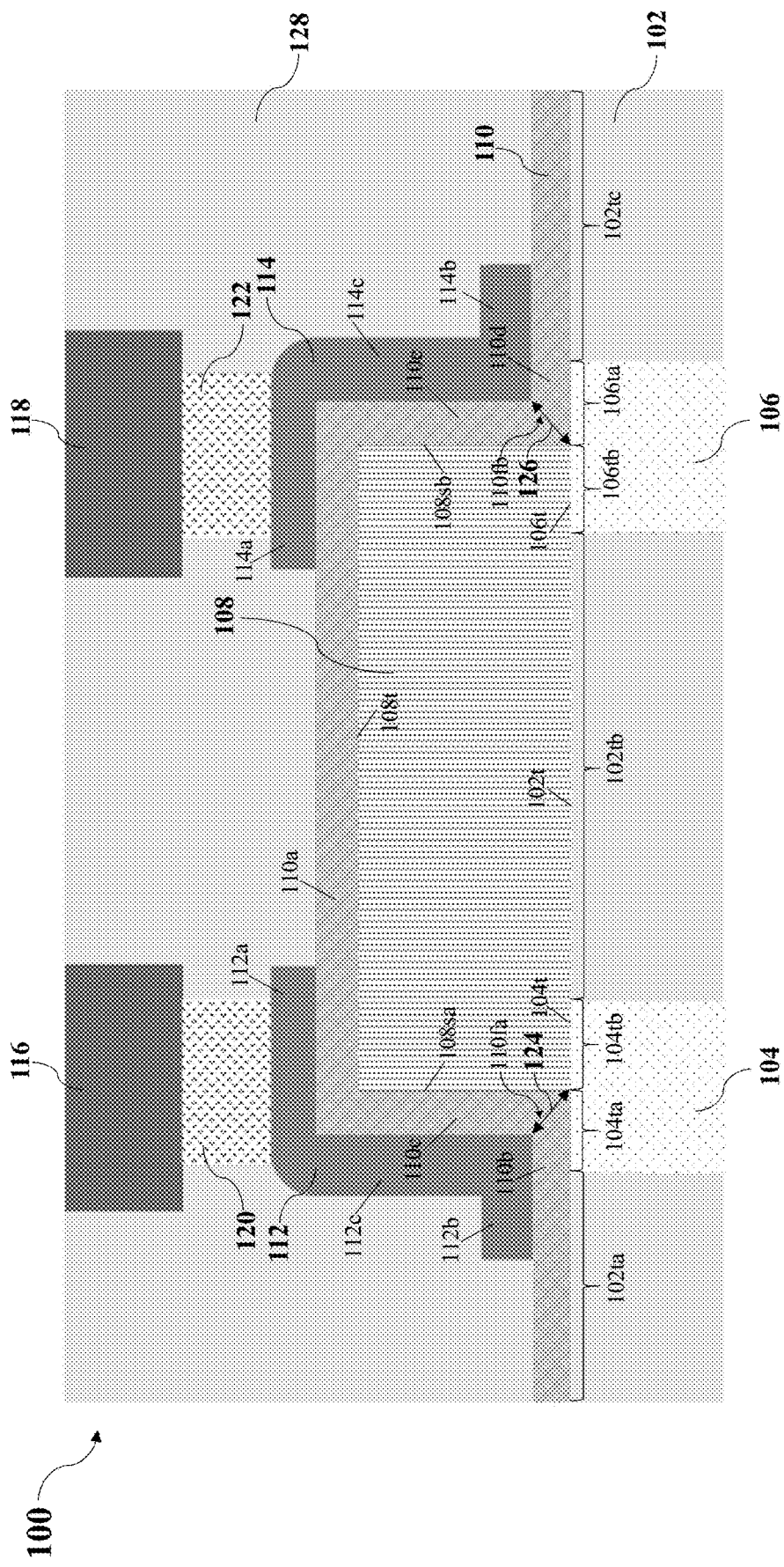
FIGS. 1A and 1B respectively show a cross-sectional view and a top view of a memory device according to various non-limiting embodiments.

The embodiments generally relate to devices, such as semiconductor devices. More particularly, some embodiments relate to memory devices, for example, non-volatile memory devices such as resistive random access memory devices (RRAMs). The memory devices may be used in various applications, such as but not limited to, neuromorphic computing development.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
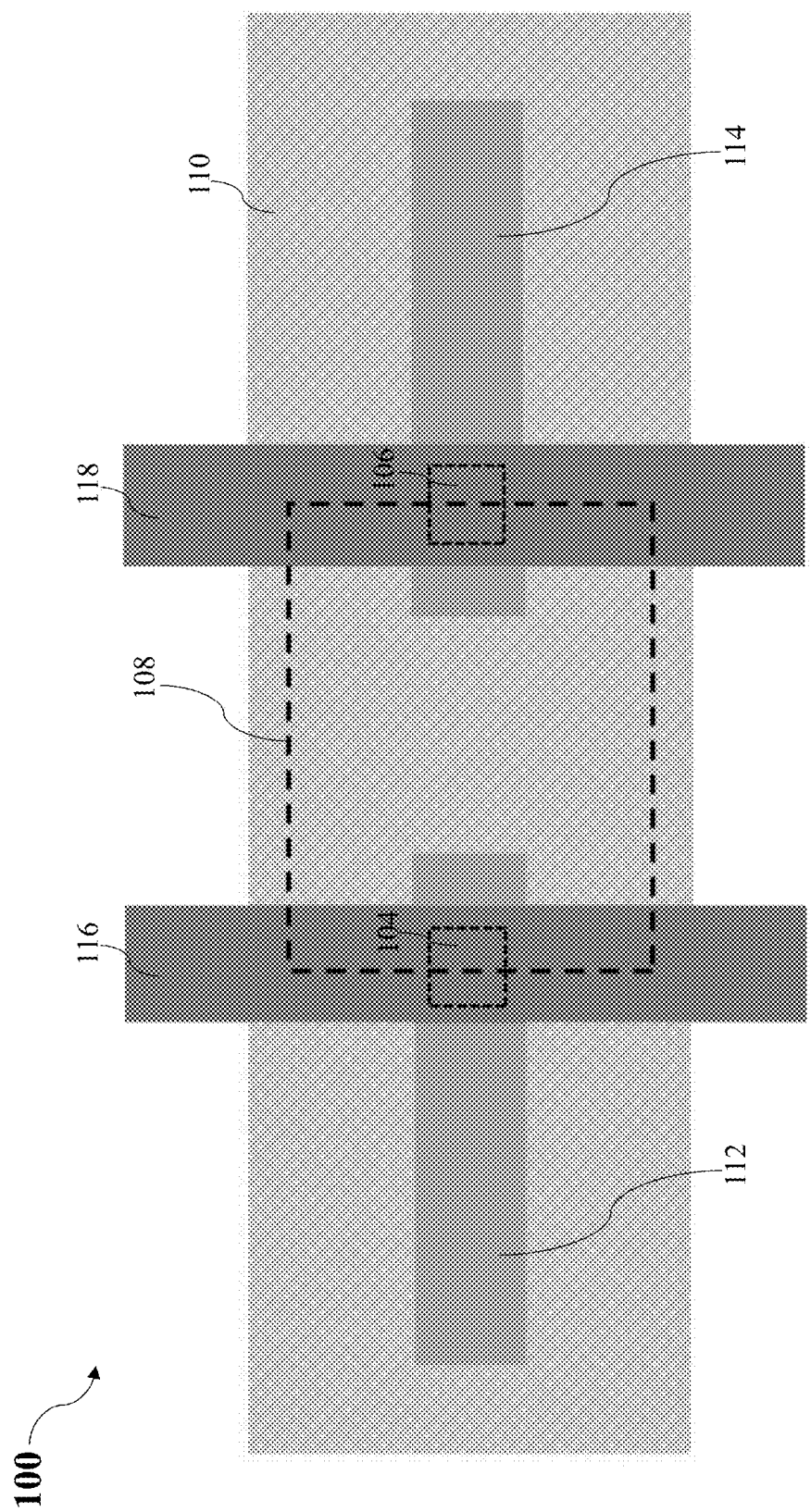

FIG. 1A shows a simplified cross-sectional view of a memory device 100 according to various non-limiting embodiments. FIG. 1B shows a top view of the memory device 100. The memory device 100 may be a non-volatile memory device, such as a resistive random access memory device (RRAM).

The memory device 100 may include an insulating layer 102. In various non-limiting embodiments, the insulating layer 102 may be referred to as an inter-layer dielectric layer. In various non-limiting embodiments, the insulating layer 102 may include insulating material such as, but not limited to, silicon oxide, silicon dioxide, silicon nitride, or combinations thereof. However, other materials as known to those skilled in the art may also be used.

The memory device 100 may further include at least one inert electrode. As illustrated in FIG. 1A, in a non-limiting example, the at least one inert electrode may include two inert electrodes 104, 106. The two inert electrodes 104, 106 may be arranged within the insulating layer 102 and may be separated from each other. In various non-limiting embodiments, each inert electrode 104, 106 may be formed of ruthenium (Ru), platinum (Pt), titanium nitride (TiN), tantalum nitride (TaN), alloys thereof, combinations thereof, or other materials as known to those skilled in the art. In various non-limiting embodiments, each inert electrode 104, 106 may be referred to as a bottom electrode. Further, in various non-limiting embodiments, a thickness of each inert electrode 104, 106 may range from about 5 nm to about 30 nm; alternatively, each inert electrode 104, 106 may have a thickness ranging from about 5 nm to about 10 nm. Although FIG. 1A shows two inert electrodes 104, 106, in alternative non-limiting examples, the memory device 100 may include two or more inert electrodes separated from each other and arranged within the insulating layer 102.

The memory device 100 may further include at least one mask element. In a non-limiting example as shown in FIG. 1A, the mask element(s) may include only a single mask element 108. The mask element 108 may be arranged over the inert electrode(s) (e.g. inert electrodes 104, 106) and the insulating layer 102. In other words, the insulating layer 102 may be arranged below the mask element 108. The mask element 108 may be in contact with a top surface 104$t$, 106$t$ of the inert electrodes 104, 106. In the non-limiting example as shown in FIG. 1A, the mask element 108 may be in contact with a segment 104$tb$ of a top surface 104$t$ of the inert electrode 104 and a segment 106$tb$ of a top surface 106$t$ of the inert electrode 106. The mask element 108 may further be in contact with a segment 102$tb$ of a top surface 102$t$ of the insulating layer 102, where this segment 102$tb$ may be between the inert electrodes 104, 106. In various non-limiting embodiments, the mask element 108 may be referred to as a hard mask. In various non-limiting embodiments, the mask element 108 may be formed of non-metals, such as, but not limited to, oxides or nitrides. For example, the mask element 108 may be formed of silicon oxide, silicon nitride, titanium oxide, combinations thereof or any other materials as known to those skilled in the art. In various non-limiting embodiments, the mask element 108 may have a length and a width limited by distances between transistors used with the memory device 100, where such distances may vary with the technology node and the type of the transistors used.

The memory device 100 may further include a switching layer 110. The switching layer 110 may be arranged over the at least one mask element (e.g. mask element 108) and the inert electrode(s) (e.g. inert electrodes 104, 106). The switching layer 110 may also be in contact with the top surface 104$t$, 106$t$ of the inert electrodes 104, 106. In a non-limiting example shown in FIG. 1A, the switching layer 110 may be in contact with a segment 104$ta$ (immediately adjacent the segment 104tb) of the top surface 104t of the inert electrode 104. The switching layer 110 may also be in contact with a segment 106ta (immediately adjacent to the segment 106tb) of the top surface 106t of the inert electrode 106. In this non-limiting example, the switching layer 110 may further line side surfaces 108sa, 108sb and a top surface 108t of the mask element 108. The switching layer 110 may also extend away from the mask element 108 such that the switching layer 110 is also in contact with the top surface 102t (e.g. segments 102ta, 102tc) of the insulating layer 102. In various non-limiting embodiments, the switching layer 110 may include a first portion 110a arranged over the mask element 108, a second portion 110b arranged over the inert electrode 104 and a third portion 110c connecting the first portion 110a and the second portion 110b. The switching layer 110 may also include a fourth portion 110d arranged over the inert electrode 106 and a fifth portion 110e connecting the first portion 110a and the fourth portion 110d. In various non-limiting embodiments, the switching layer 110 may include sharp corners. For example, an angle between the second portion 110b and the third portion 110c may range from about 85 degrees to about 95 degrees. For example, an angle between the fourth portion 110d and the fifth portion 110e may range from about 85 degrees to about 95 degrees. Further, the switching layer 110 may have a uniform thickness in some non-limiting embodiments and may have a non-uniform thickness in other non-limiting embodiments. In various non-limiting embodiments, a thickness of the switching layer 110 may be configured so that a relatively low voltage level may be sufficient to switch the resistance of the switching layer 110. A thickness of the switching layer 110 may range from about 1 nm (for example, when the switching layer 110 is formed using atomic layer deposition (ALD) in a non-limiting embodiment) to about 10 nm in various non-limiting embodiments; alternatively, the switching layer 110 may have a thickness ranging from about 2 nm to about 10 nm. In various non-limiting embodiments, a thickness of the switching layer 110 may be smaller than a thickness of the mask element 108. For example, a ratio of a thickness of the switching layer 110 to a thickness of the mask element 108 may range from about 1:2 to about 1:4 in a non-limiting embodiment. In a non-limiting example, a thickness of the switching layer 110 may be about 10 nm, and a thickness of the mask element 108 may be about 20 nm. In various non-limiting embodiments, the switching layer 110 may be formed of a first sub-layer and a second sub-layer arranged over the first sub-layer, where the first and second sub-layers may include different materials. One of the sub-layers of the switching layer 110 may be an insertion layer configured to improve the oxygen scavenging capability of the memory device 100. In various non-limiting embodiments, the switching layer 110 may be formed of magnesium oxide (MgO), tantalum oxide (TaO$_2$), hafnium oxide (HfO$_2$), titanium oxide (TiO$_2$), aluminum oxide (AlO$_2$), silicon oxide (SiO$_2$), combinations thereof, or any other materials as known to those skilled in the art.

The memory device 100 may also include at least one active electrode arranged over the switching element 110. In various non-limiting embodiments, a plurality of active electrodes (in other words, two or more active electrodes) may be separated from each other. For instance, in a non-limiting example as shown in FIG. 1A, two active electrodes 112, 114 are separated from each other. In this non-limiting example, each active electrode 112, 114 may be arranged along at least a portion of the switching layer 110. For instance, each active electrode 112, 114 may be arranged along a side wall of the switching layer 110, and thus, may be referred to as a side wall active electrode in a non-limiting example. Referring to FIG. 1A, in various non-limiting embodiments, each active electrode 112, 114 may have a first portion 112a, 114a over the mask element 108 and in contact with the first portion 110a of the switching layer 110. The active electrodes 112, 114 may further have second portions 112b, 114b over the insulating layer 102 and in contact with the second portion 110b and fourth portion 110d of the switching layer 110 respectively. A third portion 112c, 114c of each active electrode 112, 114 may connect the first portion 112a, 114a and the second portion 112b, 114b. The third portions 112c, 114c of the active electrodes 112, 114 may respectively be in contact with the third portion 110c and the fifth portion 110e of the switching layer 110. In various non-limiting embodiments, the active electrodes 112, 114 may be formed of tantalum (Ta), hafnium (Hf), titanium (Ti), copper (Cu), silver (Ag), cobalt (Co), tungsten (W), combinations thereof, or other materials as known to those skilled in the art. In various non-limiting embodiments, a thickness of each active electrode 112, 114 may range from about 30 nm to about 100 nm.

The memory device 100 may further include a plurality of voltage lines 116, 118 separated from each other and electrically coupled with the active electrode(s) (e.g. active electrodes 112, 114). Each voltage line 116, 118 may be referred to as a bit line. In various non-limiting embodiments, each voltage line 116, 118 may be arranged over one of the active electrodes 112, 114. For instance, in the non-limiting example shown in FIG. 1A, the memory device 100 may include a first voltage line 116 arranged over the active electrode 112 and a second voltage line 118 arranged over the active electrode 114. A contact 120, 122 may be arranged between each voltage line 116, 118 and the respective active electrode 112, 114 below the voltage line 116, 118, to electrically couple the voltage line 116, 118 with the active electrode 112, 114.

The memory device 100 may further include a further insulating layer 128 arranged over the switching layer 110. The further insulating layer 128 may be referred to as an inter-layer dielectric. In the non-limiting example shown in FIG. 1A, the voltage lines 116, 118, the contacts 120, 122, and the active electrodes 112, 114 may be at least partially arranged within the further insulating layer 128. In various non-limiting embodiments, the further insulating layer 128 may be formed of insulating material such as, but not limited to, silicon oxide, silicon dioxide, silicon nitride, or combinations thereof. However, other materials as known to those skilled in the art may also be used.

In various non-limiting embodiments, the switching layer 110 may include a first filament formation region 110fa and a second filament formation region 110fb in contact with both the at least one active electrode (e.g. active electrode 112/active electrode 114) and the at least one inert electrode 104, 106 (e.g. inert electrode 104/inert electrode 106). In a non-limiting example as illustrated in FIG. 1A, the first filament formation region 110fa may be at a junction/corner between the second and third portions 110b, 110c of the switching layer 110, and/or may be in contact with both the active electrode 112 and the inert electrode 104. The second filament formation region 110fb may be at a junction/corner between the fourth and fifth portions 110d, 110e of the switching layer 110, and/or may be in contact with both the active electrode 114 and the inert electrode 106. The first voltage line 116 may be nearer the first filament formation region 110fa and the second voltage line 118 may be nearer the second filament formation region 11fb.

In various non-limiting embodiments, applying a set voltage to the first voltage line 116 may provide a voltage difference between the active electrode 112 and the inert electrode 104. This voltage difference may cause the formation of one or more conducting filaments 124 in the first filament formation region 110fa to allow conduction between the active electrode 112 and the inert electrode 104. Similarly, applying a set voltage to the second voltage line 118 may provide a voltage difference between the active electrode 114 and the inert electrode 106. This voltage difference may cause the formation of one or more conducting filaments 126 in the second filament formation region 110fb to allow conduction between the active electrode 114 and the inert electrode 106. In other words, with two voltage lines 116, 118 separated from each other, the formation of the conducting filaments 124, 126 in each filament formation region 110fa, 110fb may be controlled separately by one of the voltage lines 116, 118. This can help to better confine the conducting filaments 124, 126.

In the remaining drawings, the surfaces 102t, 104t, 106t, 102ta, 102tb, 102tc, 104ta, 104tb, 106ta, 106tb, 108sa, 108sb, 108t, portions 110a, 110b, 110c, 110d, 110e, 112a, 112b, 112c, 114a, 114b, 114c, and filament confinement regions 110fa, 110fb are not labelled to avoid cluttering of the drawings.

FIGS. 2A to 2F show simplified cross-sectional views that illustrate a method for fabricating the memory device 100 according to various non-limiting embodiments.

Referring to FIG. 2A, according to various non-limiting embodiments, a method for fabricating the memory device 100 may begin by forming the inert electrode(s) (e.g. inert electrodes 104, 106). In a non-limiting example, the method may include patterning a base layer (not shown in the figures) on which the memory device 100 is to be formed using for example, a photoresist mask. Electrode material may then be deposited based on the pattern to form the inert electrodes 104, 106. The method may then include depositing insulating material onto the base layer to form the insulating layer 102.

Referring to FIG. 2B, the method may further include forming the mask element(s) (e.g. mask element 108) over the inert electrode(s) (e.g. inert electrodes 104, 106). In various non-limiting embodiments, the mask element 108 may be formed by forming a mask layer over the inert electrode(s) (e.g. inert electrodes 104, 106) and etching the mask layer to form the mask element(s) (e.g. mask element 108). In a non-limiting example, the mask layer may be formed by depositing mask material onto the insulating layer 102 and the inert electrodes 104, 106. The mask layer may then be patterned and etched using for example, a photoresist mask, to form the mask element 108.

Referring to FIG. 2C, the method may further include forming the switching layer 110 over the at least one mask element (e.g. mask element 108) and the at least one inert electrode (e.g. inert electrodes 104, 106). In a non-limiting example, the switching layer 110 may be formed by depositing an oxide material over the mask element 108 and the inert electrodes 104, 106.

Referring to FIG. 2D, the method may further include forming the active electrode(s) (e.g. active electrodes 112, 114) over the switching layer 110. In various non-limiting embodiments, the method may include forming an electrode layer over the switching layer 110 and etching the electrode layer to form the at least one active electrode (e.g. active electrodes 112, 114). In a non-limiting example, the electrode layer may be formed by depositing electrode material onto the switching layer 110, and the electrode layer may then be patterned and etched, using for example, a photoresist mask. In various non-limiting embodiments, the mask element 108 may help to prevent shorting of the active electrodes 112, 114 and the inert electrodes 104, 106 during the etching process.

Referring to FIG. 2E, the method may further include forming a first part of the further insulating layer 128 over the switching layer 110. In a non-limiting example, the first part of the further insulating layer 128 may be formed by depositing insulating material over the switching layer 110 and the active electrodes 112, 114, and smoothing a top surface of the insulating material such that the top surface of the insulating material is aligned with top surfaces of the active electrodes 112, 114. Smoothing the top surface of the insulating material may be done using processes such as, but not limited to, a chemical mechanical polishing (CMP) process.

Referring to FIG. 2F, the method may further include forming the contacts 120, 122 and the voltage lines 116, 118. In a non-limiting example, the contacts 120, 122 may first be formed by depositing a first conductive material over regions where the contacts 120, 122 are to be formed (using for example, a first photoresist mask). The voltage lines 116, 118 may then be formed by depositing a second conductive material over regions where the voltage lines 116, 118 are to be formed (using for example, a second photoresist mask). The first and second conductive material may include aluminium, copper, tungsten, alloys thereof, combinations thereof, or other materials as known to those skilled in the art. Referring to FIG. 2F, the method may further include forming a second part of the further insulating layer 128. In a non-limiting example, this may be done by depositing insulating material over the first part of the further insulating layer 128 and smoothing a top surface of the second part of the further insulating layer 128. The smoothing may be done using processes such as, but not limited to, a CMP process.

The above described order for the method is only intended to be illustrative, and the method is not limited to the above specifically described order unless otherwise specifically stated.

Figure 3:
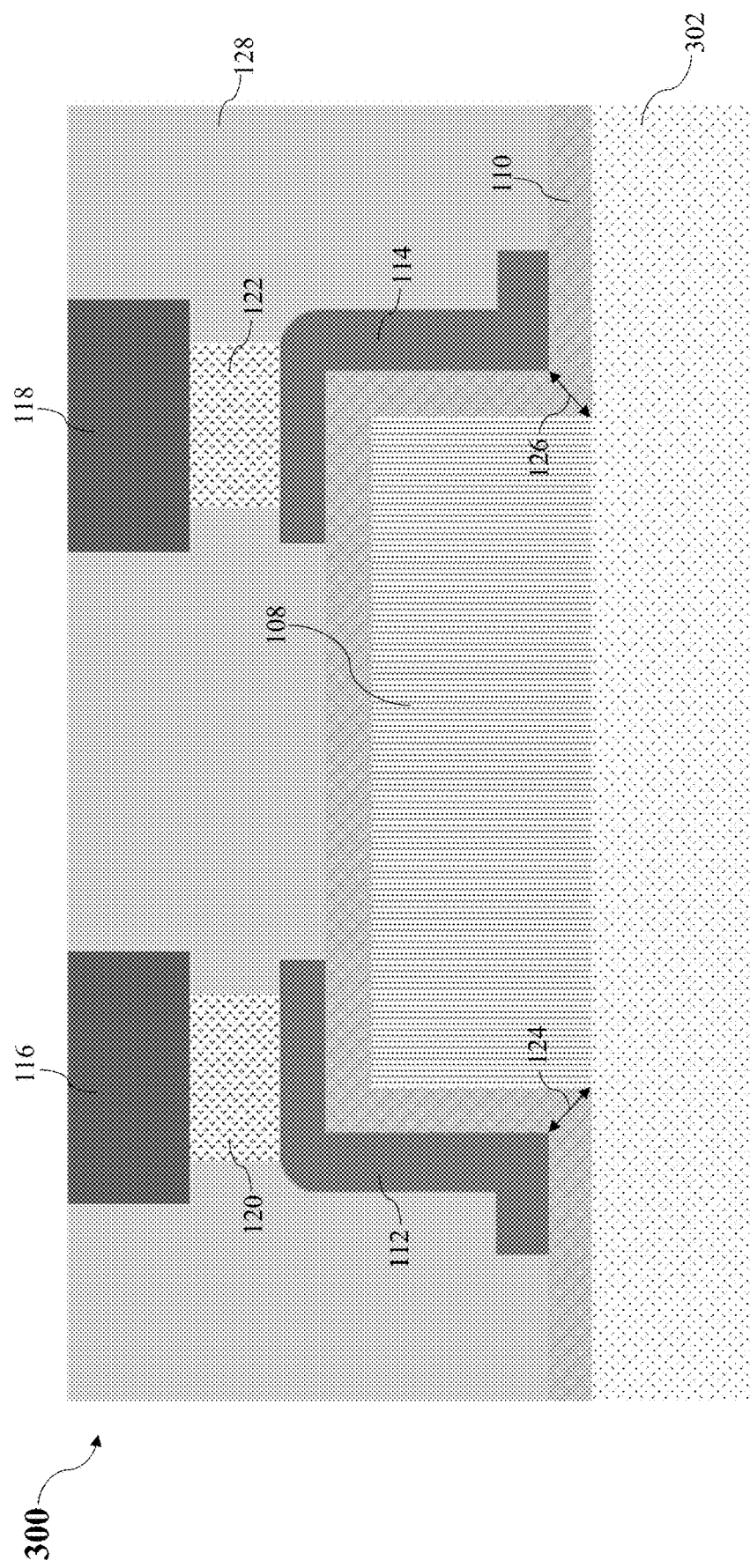
FIG. 3 shows a cross-sectional view of a memory device according to alternative non-limiting embodiments.

FIG. 3 shows a simplified cross-sectional view of a memory device 300 according to alternative non-limiting embodiments. Memory device 300 is similar to memory device 100, and thus the common features are labelled with the same reference numerals and need not be discussed. As shown in FIG. 3, instead of two separate inert electrodes 104, 106, the memory device 300 may include only a single inert electrode 302.

Figure 4:
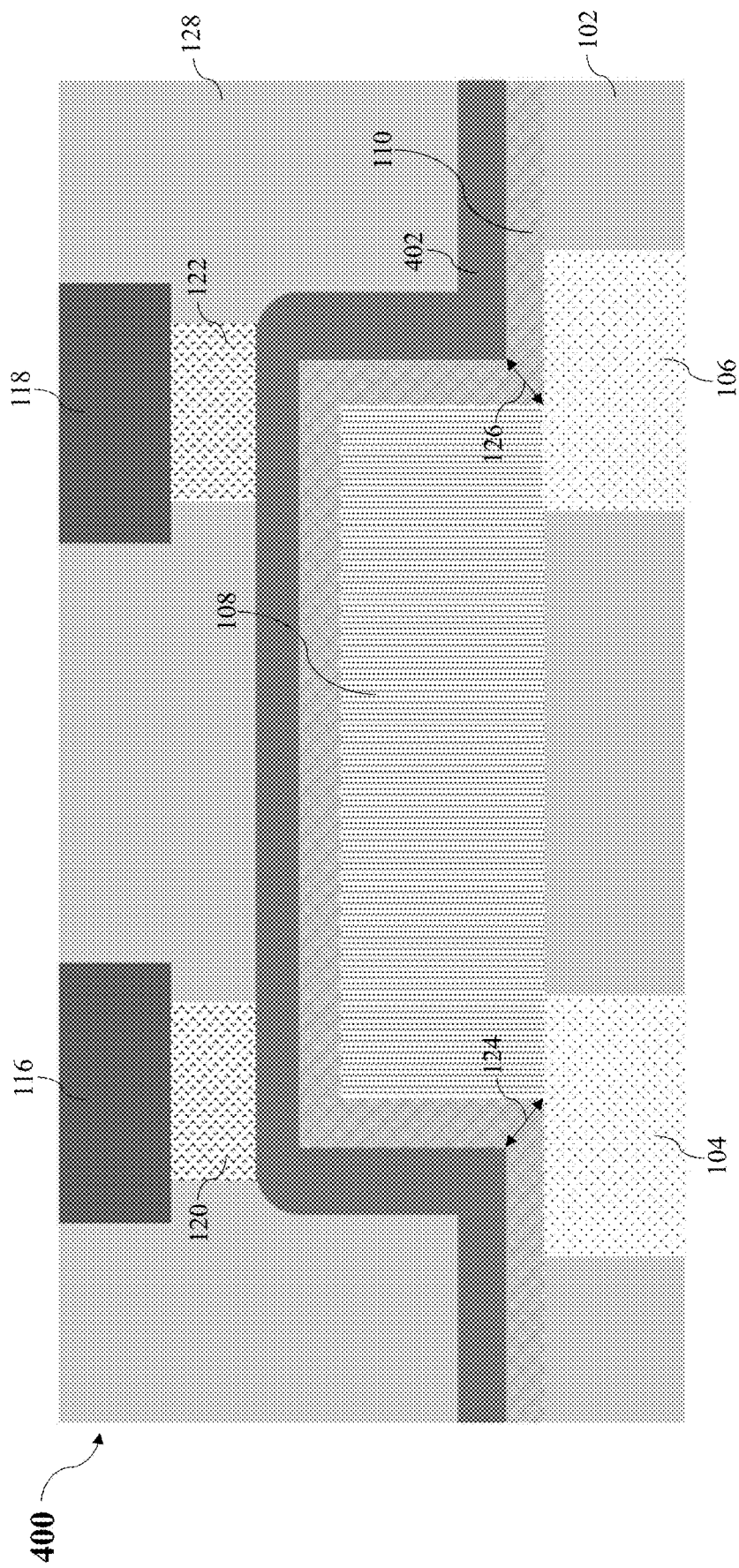
FIG. 4 shows a cross-sectional view of a memory device according to alternative non-limiting embodiments.

FIG. 4 shows a simplified cross-sectional view of a memory device 400 according to alternative non-limiting embodiments. Memory device 400 is similar to memory device 100, and thus the common features are labelled with the same reference numerals and need not be discussed. As shown in FIG. 4, instead of two separate active electrodes 112, 114, the memory device 400 may include only a single active electrode 402. In various non-limiting embodiments, the fabrication of the memory device 400 may be simpler than the fabrication of the memory device 100 as the step of etching to form the separate active electrodes 112, 114 may be omitted.

Figure 5:
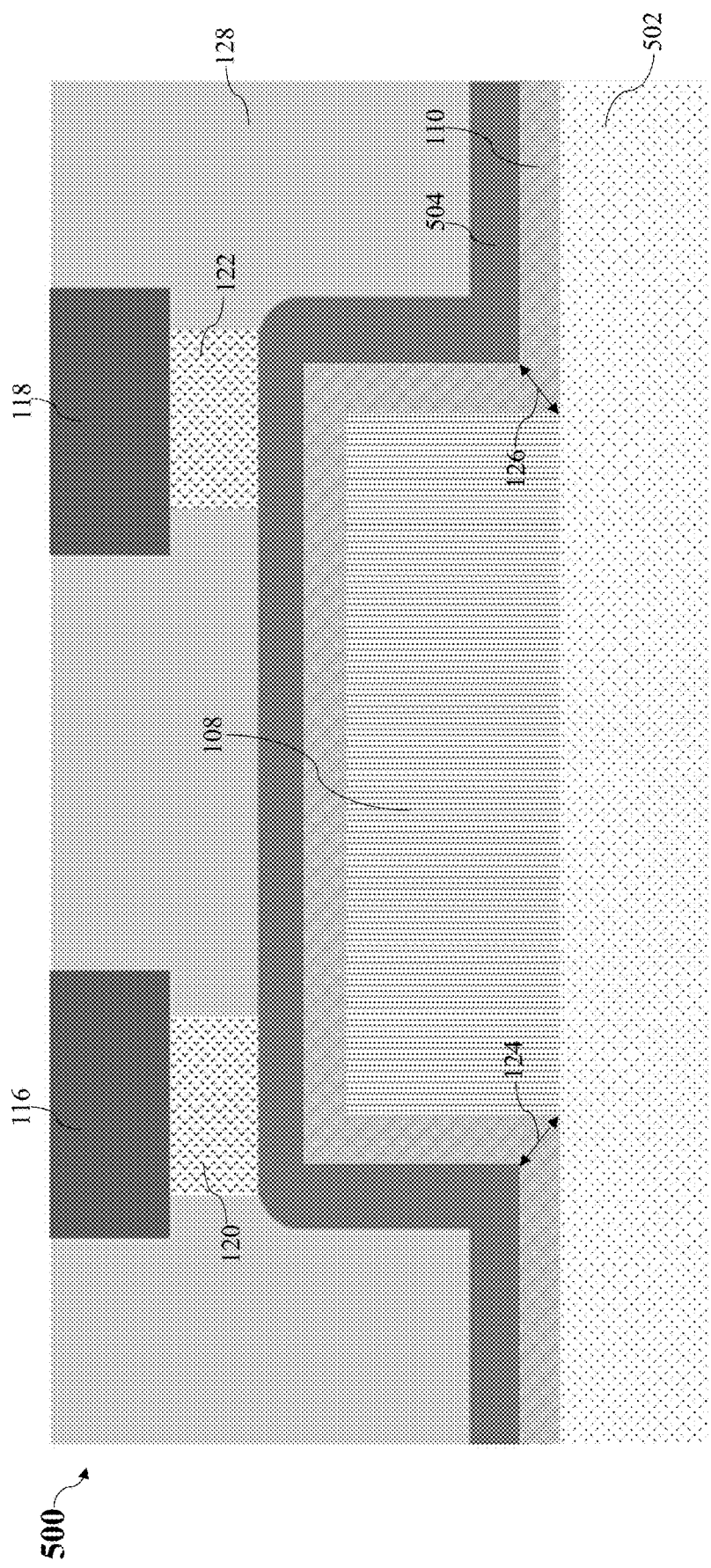
FIG. 5 shows a cross-sectional view of a memory device according to alternative non-limiting embodiments.

FIG. 5 shows a simplified cross-sectional view of a memory device 500 according to alternative non-limiting embodiments. Memory device 500 is similar to memory device 100, and thus the common features are labelled with the same reference numerals and need not be discussed. As shown in FIG. 5, in various alternative non-limiting embodiments, the memory device 500 may include only a single inert electrode 502 and only a single active electrode 504.

Figure 6:
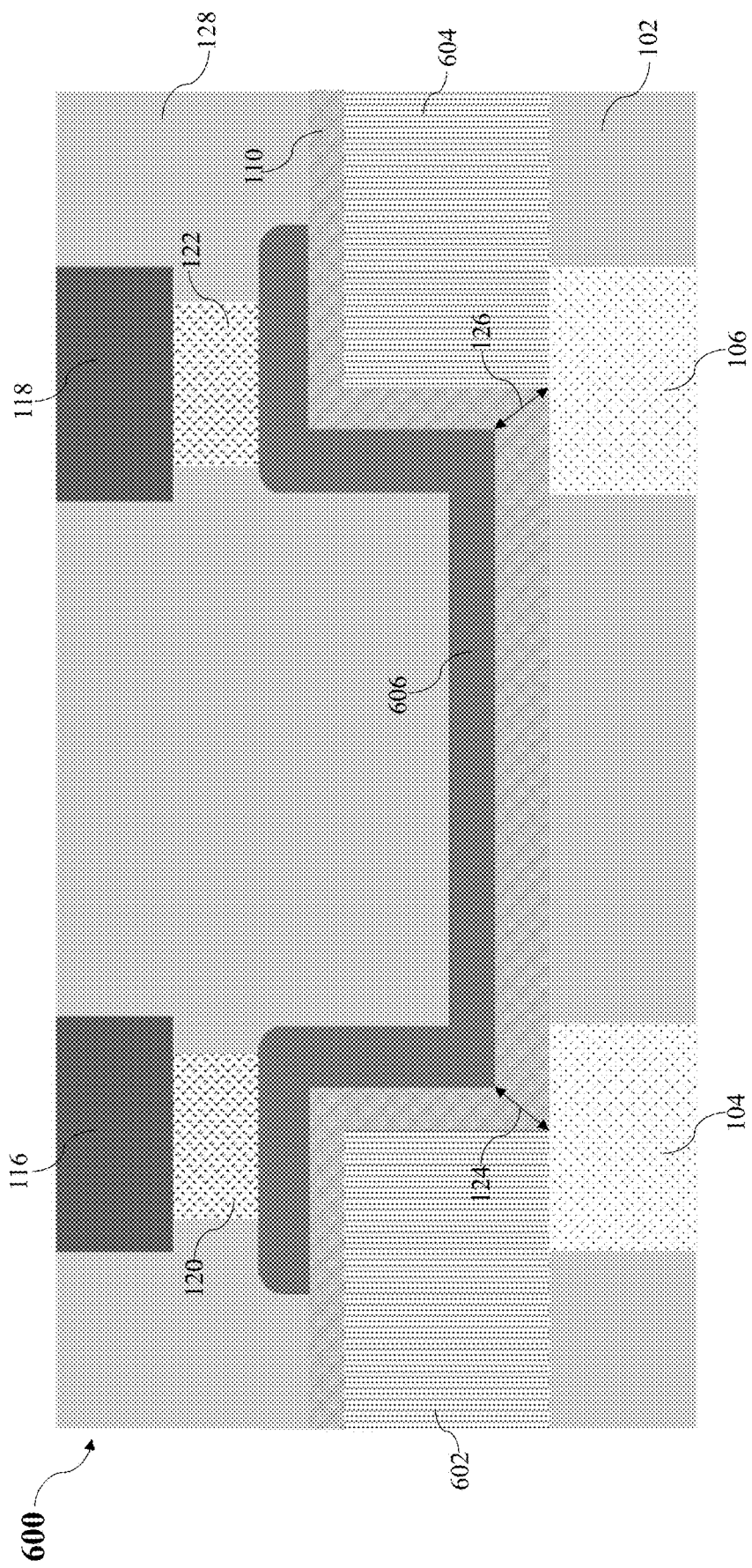
FIG. 6 shows a cross-sectional view of a memory device according to alternative non-limiting embodiments.

In various alternative non-limiting embodiments, instead of a single mask element 108, there may be two or more mask elements separated from each other. FIG. 6 shows a simplified cross-sectional view of a memory device 600 according to alternative non-limiting embodiments. Memory device 600 is similar to memory device 100, and thus the common features are labelled with the same reference numerals and need not be discussed. As shown in FIG. 6, in various alternative non-limiting embodiments, the memory device 600 may include two mask elements 602, 604 separated from each other. In various non-limiting embodiments, each mask element 602, 604 may have dimensions (e.g. length and width) dependent on dimensions (e.g. length and width) of the inert electrodes 104, 106. In various non-limiting embodiments, a ratio of a length of each inert electrode 104, 106 to a length of each mask element 602, 604 may range from about 1:2 to about 1:4, and a ratio of a width of each inert electrode 104, 106 to a width of each mask element 602, 604 may range from about 1:1 to about 1:2. In various non-limiting embodiments, about 30 percent to about 70 percent of the top surface area of each inert electrode 104, 106 may be in contact with a respective mask element 602, 604. In a non-limiting example, each inert electrode 104, 106 may have a length of about 100 nm and a width of about 100 nm, and each mask element 602, 604 may have a length of about 200 nm and a width of about 100 nm. In this non-limiting example, a portion of the top surface area of each inert electrode 104, 106 in contact with a respective mask element 602, 604 may have a length of about 50 nm and a width of about 100 nm (in other words, this portion may have an area about half (50 percent) of the top surface area of the inert electrode 104, 106). In various non-limiting embodiments, a maximum length of the mask elements 602, 604 may be dependent on the sizes of the transistors and technology node used with the memory device 600. A thickness of each mask element 602, 604 may be larger than a thickness of the switching layer 110. In various non-limiting embodiments, a thickness ratio of the switching layer 110 to each mask element 602, 604 may be about 1:2 to about 1:4. For example, a thickness of the switching layer 110 may be about 10 nm and a thickness of each mask element 602, 604 may be about 20 nm. The memory device 600 may also include a single active electrode 606 that may be arranged between the mask elements 602, 604. Although FIG. 6 shows only a single active electrode 606, in alternative non-limiting embodiments, two or more active electrodes may be arranged between the mask elements 602, 604, where each of the two or more active electrodes may be electrically coupled with one of the voltage lines 116, 118.

Figure 7:
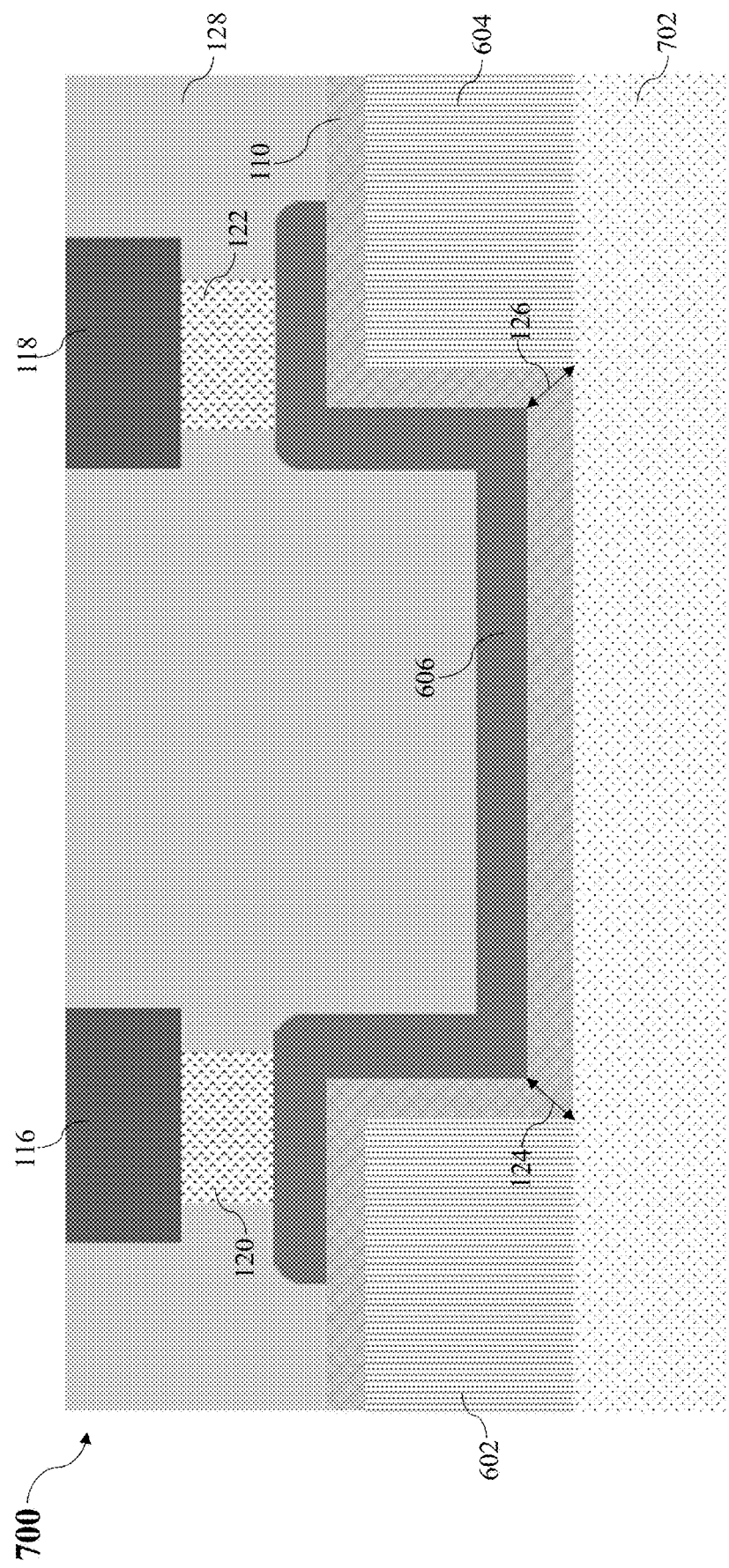
FIG. 7 shows a cross-sectional view of a memory device according to alternative non-limiting embodiments.

FIG. 7 shows a simplified cross-sectional view of a memory device 700 according to alternative non-limiting embodiments. Memory device 700 is similar to memory device 600, and thus the common features are labelled with the same reference numerals and need not be discussed. As shown in FIG. 7, in various alternative non-limiting embodiments, the memory device 700 may similarly include two mask elements 602, 604 separated from each other and a single active electrode 606 arranged between the mask elements 602, 604. However, instead of two separate inert electrodes 104, 106, the memory device 700 may include only a single inert electrode 702.

Figure 8:
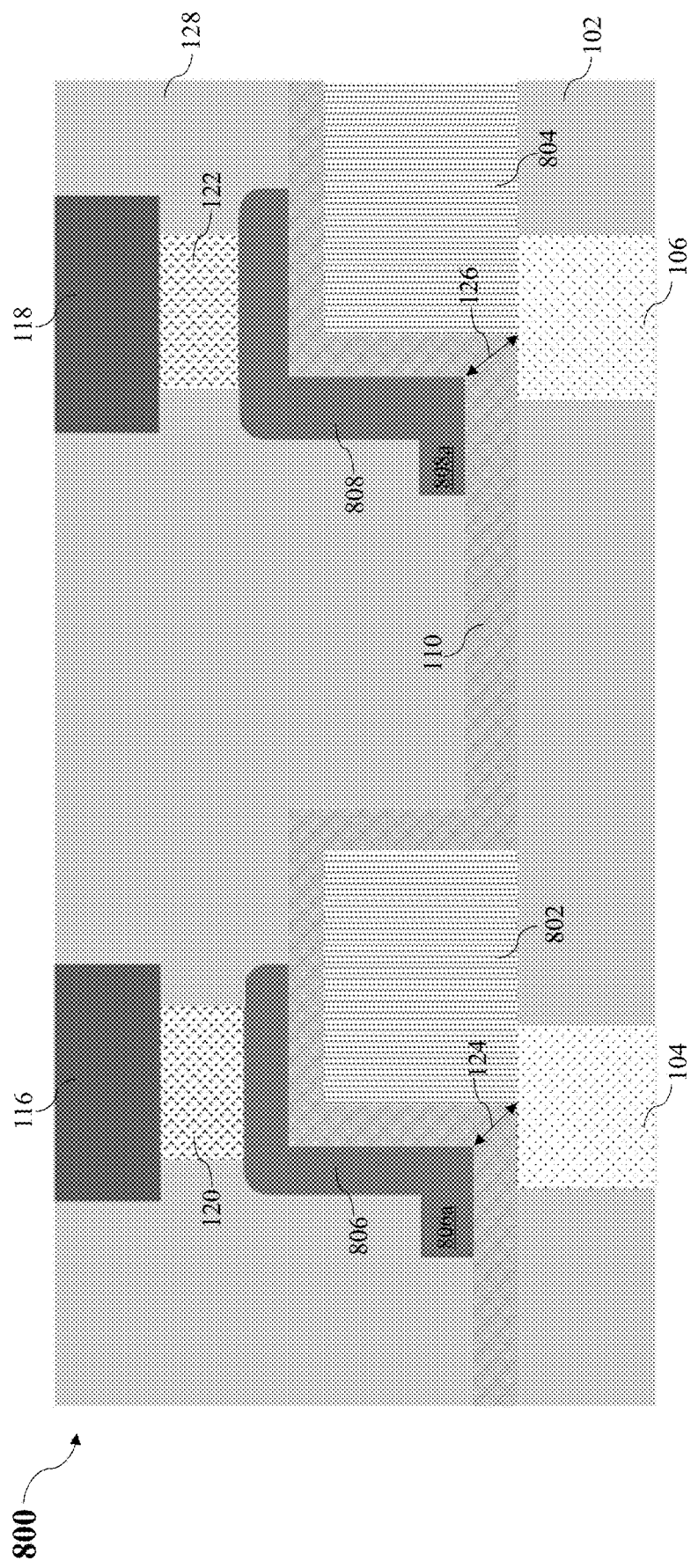
FIG. 8 shows a cross-sectional view of a memory device according to alternative non-limiting embodiments.

In various alternative non-limiting embodiments, there may be two or more mask elements separated from each other, and there may be a plurality of separate active electrodes where each active electrode may be arranged at a same side of each of the two or more mask elements. FIG. 8 shows a simplified cross-sectional view of a memory device 800 according to various alternative non-limiting embodiments. The memory device 800 is similar to memory device 100, and thus the common features are labelled with the same reference numerals and need not be discussed.

As shown in FIG. 8, in various alternative non-limiting embodiments, the memory device 800 may include two mask elements 802, 804 separated from each other. In various non-limiting embodiments, each mask element 802, 804 may have dimensions similar to that of the mask elements 602, 604 of the memory device 600 as described above. The memory device 800 may further include two active electrodes 806, 808. Each active electrode 806, 808 may be arranged on a same side of a respective mask element 802, 804. Although FIG. 8 shows each active electrode 806, 808 arranged on a left side of the respective mask element 802, 804, in alternative non-limiting embodiments, each active electrode 806, 808 may be arranged on a right side of the respective mask element 802, 804.

Figure 9:
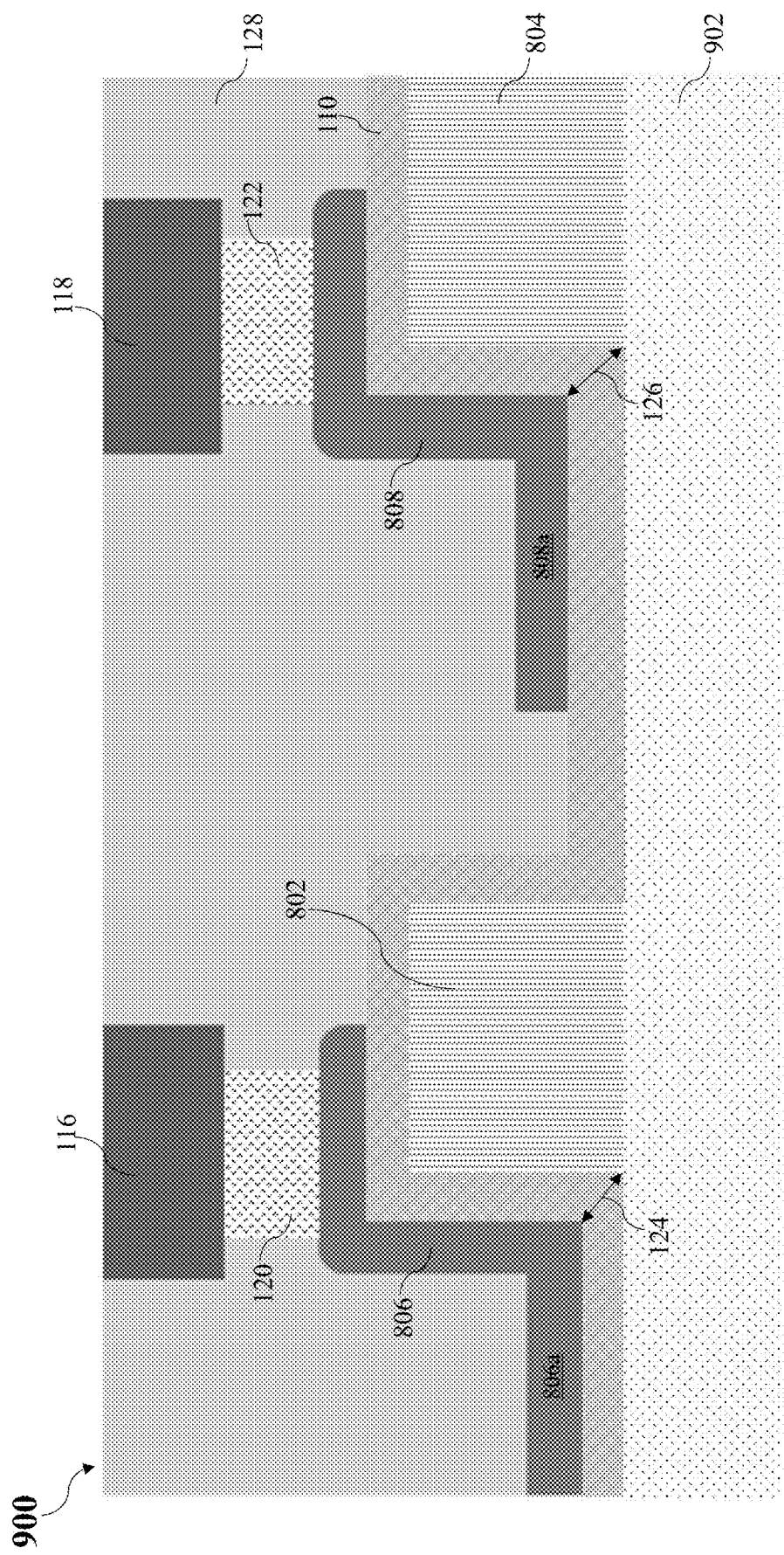
FIG. 9 shows a cross-sectional view of a memory device according to alternative non-limiting embodiments.

FIG. 9 shows a memory device 900 according to various alternative non-limiting embodiments. The memory device 900 is similar to memory device 800, and thus the common features are labelled with the same reference numerals and need not be discussed. As shown in FIG. 9, the memory device 900 may similarly include two mask elements 802, 804 separated from each other and two active electrodes 806, 808, each arranged on a same side of a respective mask element 802, 804. However, instead of two separate inert electrodes 104, 106, the memory device 900 may include only a single inert electrode 902. In addition, the end portions 806a, 808a of the active electrodes 806, 808 of the memory device 900 may extend further away from the respective mask elements 802, 804 as compared to those in FIG. 8. However, these end portions 806a, 808a may be shorter (in other words, similar to those in FIG. 8) in alternative non-limiting embodiments.

In various non-limiting embodiments, the conducting filaments 124, 126 of the memory devices 100-900 may be confined within filament formation regions 110fa, 110fb between the side wall active electrodes 112, 114, 402, 504, 606, 806, 808 and the inert electrodes 104, 106, 302, 502, 702, 902. For example, the conducting filaments 124, 126 may be confined within corners of the switching layer 110 (e.g. between the second and third portions 110b, 110c and/or between the fourth and fifth portions 110d, 110e in various non-limiting embodiments). In various non-limiting embodiments, electric fields may be enhanced at these corners of the switching layer 110 and thus, the switching voltages of the memory devices 100-900 may be reduced. The confinement of the conducting filaments 124, 126 may also help to reduce the stochasticity of the conducting filaments' 124, 126 formation, in turn reducing the cycle-to-cycle and device-to-device variability of the memory devices 100-900 in the high resistance state (HRS). In other words, the variability of the resistance of the switching layer 110 (and thus, the memory device 100-900) in the high resistance state (HRS) may be reduced.

Similar to the memory device 100, the separate voltage lines 116, 118 of the memory devices 300-900 can allow the control of the conducting filaments' 124 formation in the filament formation region 110fa to be more separated from the control of the conducting filaments' 126 formation in the filament formation region 110fb. This can in turn help to better confine the conducting filaments 124, 126. However, in alternative non-limiting embodiments, the memory devices 100-900 may include only a single voltage line instead of separate voltage lines 116, 118. In these alternative non-limiting embodiments, the single voltage line may be used to control the conducting filament formation for multiple filament formation regions, where each filament formation region may be in contact with at least one active electrode and at least one inert electrode.

In various non-limiting embodiments, the memory devices 100-900 may be compatible with complementary metal-oxide semiconductor (CMOS) processes. In various non-limiting embodiments, the memory devices 100-900 may be implemented in 22 nm, 28 nm, 40 nm technology. As described above, the memory device 100 may be formed using the method described with reference to FIGS. 2A to 2F. In various non-limiting embodiments, the memory devices 300-900 may also be formed using methods similar to this method. With such methods, a thinner switching layer 110 and larger mask elements 108, 602, 604, 802, 804 may be achieved for the memory devices 100-900. In addition, the dimensions of the active electrodes 112, 114, 402, 504, 606, 806, 808 and the mask elements 108, 602, 604, 802, 804 may not be limited by lithography processes. Therefore, the scalability of the memory devices 100-900 may be improved. This may help to achieve multi-level states memory structures which may be used in neuromorphic computing development.

In various non-limiting embodiments, the memory devices 100-900 may be used for 1 transistor 1 resistor (1T1R) memory structures or for 1 transistor n resistors (1TnR) memory structures. In various non-limiting embodiments, a memory array including a plurality of memory devices may be provided, where each memory device may be one of memory devices 100-900. The memory array may have a cross-bar configuration, a 3D configuration, a 1 selector 1 resistor (1S1R) configuration, a 1 selector n resistors (1SnR) configuration, combinations thereof, or any other configurations as known to those skilled in the art.

The following examples pertain to further embodiments.

Example 1 may be a memory device including at least one inert electrode; at least one mask element arranged over the at least one inert electrode; a switching layer arranged over the at least one mask element and the at least one inert electrode, and at least one active electrode arranged over the switching layer. Both of the at least one mask element and the switching layer may be in contact with a top surface of the at least one inert electrode.

In Example 2, the subject matter of Example 1 may optionally include that the at least one inert electrode may include two or more inert electrodes separated from each other.

In Example 3, the subject matter of Example 2 may optionally include that the memory device may further include an insulating layer below the at least one mask element and the two or more inert electrodes may be arranged within the insulating layer.

In Example 4, the subject matter of Example 1 may optionally include that the at least one inert electrode may include only a single inert electrode.

In Example 5, the subject matter of any one of Examples 1 to 4 may optionally include that the at least one active electrode may include two or more active electrodes separated from each other.

In Example 6, the subject matter of any one of Examples 1 to 4 may optionally include that the at least one active electrode may include only a single active electrode.

In Example 7, the subject matter of any one of Examples 1 to 6 may optionally include that the at least one mask element may include only a single mask element.

In Example 8, the subject matter of any one of Examples 1 to 6 may optionally include that the at least one mask element may include two or more mask elements separated from each other.

In Example 9, the subject matter of Example 8 may optionally include that the at least one active electrode may be arranged between the two or more mask elements.

In Example 10, the subject matter of Example 8 may optionally include that the at least one active electrode may include a plurality of separate active electrodes, and each active electrode may be arranged at a same side of each of the two or more mask elements.

In Example 11, the subject matter of any one of Examples 1 to 10 may optionally include that the switching layer may include: a first portion arranged over the at least one mask element; a second portion arranged over the at least one inert electrode; and a third portion connecting the first portion and the second portion. An angle between the second portion and the third portion ranges from about 85 degrees to about 95 degrees.

In Example 12, the subject matter of any one of Examples 1 to 11 may optionally include that the memory device may further include a plurality of voltage lines separated from each other and electrically coupled with the at least one active electrode.

In Example 13, the subject matter of Example 12 may optionally include that the switching layer may include a first filament formation region and a second filament formation region in contact with both the at least one active electrode and the at least one inert electrode. A first voltage line of the plurality of voltage lines may be nearer the first filament formation region and a second voltage line of the plurality of voltage lines may be nearer the second filament formation region.

In Example 14, the subject matter of Example 12 or Example 13 may optionally include that the at least one active electrode may include a plurality of active electrodes and each voltage line of the plurality of voltage lines may be arranged over one of the active electrodes of the plurality of active electrodes.

In Example 15, the subject matter of any one of Examples 1 to 14 may optionally include that the memory device may be a resistive random access memory device.

Example 16 may be a method including: forming at least one inert electrode; forming at least one mask element over the at least one inert electrode; forming a switching layer over the at least one mask element and the at least one inert electrode, and forming at least one active electrode over the switching layer. Both of the at least one mask element and the switching layer may be in contact with a top surface of the at least one inert electrode.

In Example 17, the subject matter of Example 16 may optionally include that forming the at least one mask element over the at least one inert electrode may include: forming a mask layer over the at least one inert electrode; and etching the mask layer to form the at least one mask element.

In Example 18, the subject matter of Example 16 or Example 17 may optionally include that forming the at least one active electrode over the switching layer may include: forming an electrode layer over the switching layer; and etching the electrode layer to form the at least one active electrode.

Example 19 may be a memory array that may include a plurality of memory devices, where one or more of the plurality of memory devices may include: at least one inert electrode; at least one mask element arranged over the at least one inert electrode; a switching layer arranged over the at least one mask element and the at least one inert electrode, and at least one active electrode arranged over the switching layer. Both of the at least one mask element and the switching layer may be in contact with a top surface of the at least one inert electrode.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   at least one inert electrode;
   at least one electrically insulating element arranged over the at least one inert electrode;
   a switching layer arranged over the at least one electrically insulating element and the at least one inert electrode, wherein both of the at least one electrically insulating element and the switching layer are in contact with a top surface of the at least one inert electrode; and
   at least one active electrode arranged over the switching layer,
   wherein the at least one active electrode comprises a plurality of active electrodes separated from each other and electrically independent of each other.

2. The memory device of claim 1, wherein the at least one inert electrode comprises a plurality of inert electrodes separated from each other.

3. The memory device of claim 2, wherein the memory device further comprises an insulating layer below the at least one electrically insulating element and wherein the plurality of inert electrodes are arranged within the insulating layer.

4. The memory device of claim 1, wherein the at least one electrically insulating element comprises a single electrically insulating element.

5. The memory device of claim 1, wherein the switching layer comprises:
   a first portion arranged over the at least one electrically insulating element;
   a second portion arranged over and abutting the top surface of the at least one inert electrode; and
   a third portion connecting the first portion and the second portion;
   wherein an angle between the second portion and the third portion ranges from about 85 degrees to about 95 degrees.

6. The memory device of claim 5, wherein the at least one active electrode comprises:
   a first portion disposed in direct contact with the first portion of the switching layer;
   a second portion disposed in direct contact with the second portion of the switching layer; and
   a third portion connecting the first portion and the second portion of the at least one active electrode;
   wherein the third portion of the at least one active electrode is arranged to be orthogonal to each of the first portion and the second portion of the at least one active electrode.

7. The memory device of claim 1, wherein the memory device further comprises a plurality of voltage lines separated from each other and electrically coupled with the at least one active electrode.

8. The memory device of claim 7,
   wherein the switching layer comprises a first filament formation region and a second filament formation region in contact with both the at least one active electrode and the at least one inert electrode; and
   wherein a first voltage line of the plurality of voltage lines is nearer the first filament formation region and a second voltage line of the plurality of voltage lines is nearer the second filament formation region.

9. The memory device of claim 7, wherein the at least one active electrode comprises a plurality of active electrodes and each voltage line of the plurality of voltage lines is arranged over one of the active electrodes of the plurality of active electrodes.

10. The memory device of claim 1, wherein the memory device is a resistive random access memory device.

11. The memory device of claim 1, wherein the at least one electrically insulating element comprises at least one non-metal element.

12. The memory device of claim 1, wherein the at least one electrically insulating element comprises at least one oxide element or at least one nitride element.

13. A method comprising:
   forming at least one inert electrode;
   forming at least one electrically insulating element over the at least one inert electrode;
   forming a switching layer over the at least one electrically insulating element and the at least one inert electrode, wherein both of the at least one electrically insulating element and the switching layer are in contact with a top surface of the at least one inert electrode; and
   forming at least one active electrode over the switching layer,
   wherein the at least one active electrode comprises a plurality of active electrodes separated from each other and electrically independent of each other.

14. A memory array comprising a plurality of memory devices, wherein each of the plurality of memory devices comprises:
   at least one inert electrode;
   at least one electrically insulating element arranged over the at least one inert electrode;
   a switching layer arranged over the at least one electrically insulating element and the at least one inert electrode, wherein both of the at least one electrically insulating element and the switching layer are in contact with a top surface of the at least one inert electrode; and
   at least one active electrode arranged over the switching layer,
   wherein the at least one active electrode comprises a plurality of active electrodes separated from each other and electrically independent of each other.

* * * * *